United States Patent
Kobayashi et al.

(10) Patent No.: US 12,214,829 B2
(45) Date of Patent: Feb. 4, 2025

(54) CURRENT DETECTION DEVICE, MOTOR CONTROL DEVICE, AND ELECTRIC POWER STEERING DEVICE

(71) Applicant: NSK LTD., Tokyo (JP)

(72) Inventors: Takayuki Kobayashi, Tokyo (JP); Kyosho Uryu, Tokyo (JP)

(73) Assignee: NSK LTD., Tokyo (JP)

( * ) Notice: Subject to any disclaimer, the term of this patent is extended or adjusted under 35 U.S.C. 154(b) by 0 days.

(21) Appl. No.: 18/721,458

(22) PCT Filed: Dec. 8, 2022

(86) PCT No.: PCT/JP2022/045301
§ 371 (c)(1),
(2) Date: Jun. 18, 2024

(87) PCT Pub. No.: WO2023/157432
PCT Pub. Date: Aug. 24, 2023

(65) Prior Publication Data
US 2024/0416990 A1    Dec. 19, 2024

(30) Foreign Application Priority Data
Feb. 18, 2022   (JP) .................................. 2022-023749

(51) Int. Cl.
  *H02P 1/30*    (2006.01)
  *B62D 5/04*    (2006.01)
  (Continued)

(52) U.S. Cl.
  CPC ........... *B62D 5/046* (2013.01); *B62D 5/0475* (2013.01); *H02P 27/08* (2013.01)

(58) Field of Classification Search
  CPC ........ B62D 5/046; B62D 5/0475; H02P 27/08
  (Continued)

(56) References Cited

U.S. PATENT DOCUMENTS

2005/0125124 A1   6/2005   Nagase et al.
2011/0074329 A1   3/2011   Matsushita et al.
(Continued)

FOREIGN PATENT DOCUMENTS

| JP | 4474896 B2    | 6/2010 |
| JP | 2010-207087 A | 9/2010 |
| JP | 2011-072151 A | 4/2011 |

OTHER PUBLICATIONS

International Search Report for PCT/JP2022/045301 dated Jan. 10, 2023.
(Continued)

*Primary Examiner* — Erick D Glass
(74) *Attorney, Agent, or Firm* — Sughrue Mion, PLLC

(57) ABSTRACT

A current detection device includes a current detection unit configured to detect current flowing through a switching element of a lower-side arm; a correction value calculation unit configured to calculate an offset correction value, based on a detection value of the current detected by the current detection unit in a period during which the switching element off during PWM control, and to hold and update the calculated offset correction value; and a correction unit configured to correct, by the offset correction value held by the correction value calculation unit, the detection value of the current detected by the current detection unit in a period during which the switching element is on. The correction value calculation unit is configured to not update the offset correction value in a case where a duty ratio of the PWM control is equal to or less than a duty ratio lower limit value.

10 Claims, 9 Drawing Sheets

(51) Int. Cl.
*H02P 1/52* (2006.01)
*H02P 3/00* (2006.01)
*H02P 27/08* (2006.01)

(58) Field of Classification Search
USPC .......................................................... 318/503
See application file for complete search history.

(56) References Cited

U.S. PATENT DOCUMENTS

| | | | |
|---|---|---|---|
| 2018/0167014 A1* | 6/2018 | Kawamura | ............. H02P 27/02 |
| 2022/0115892 A1* | 4/2022 | Ichikawa | ............. H01M 10/443 |
| 2023/0114838 A1* | 4/2023 | Sumi | ....................... H02P 23/16 |
| | | | 318/503 |

OTHER PUBLICATIONS

International Preliminary Report on Patentablitliy for PCT/JP2022/045301 dated Jul. 10, 2023.

\* cited by examiner

FIG. 6
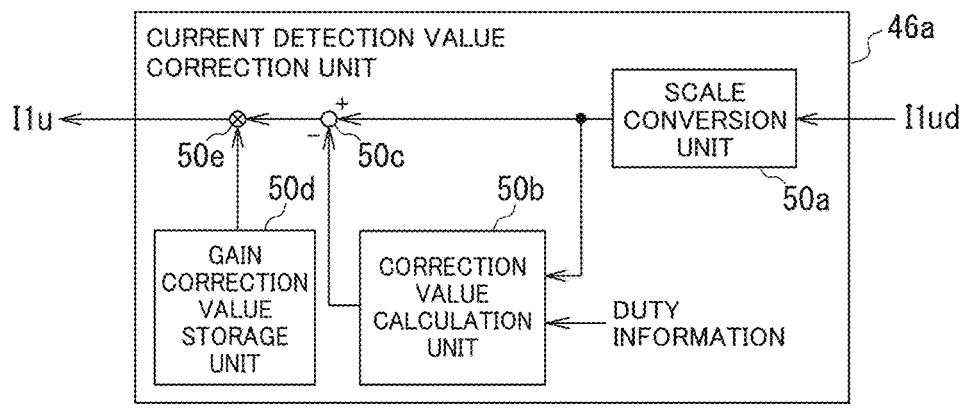
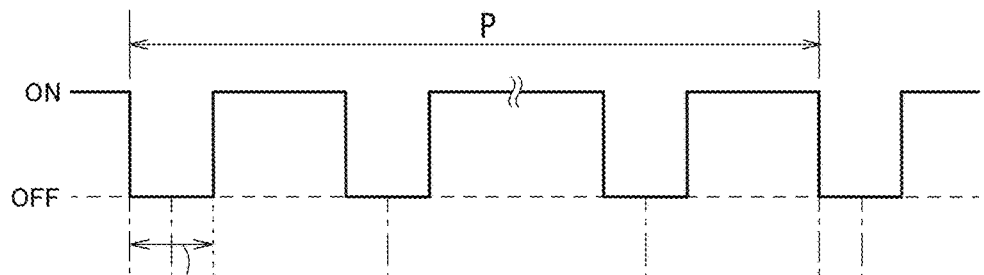
FIG. 7A
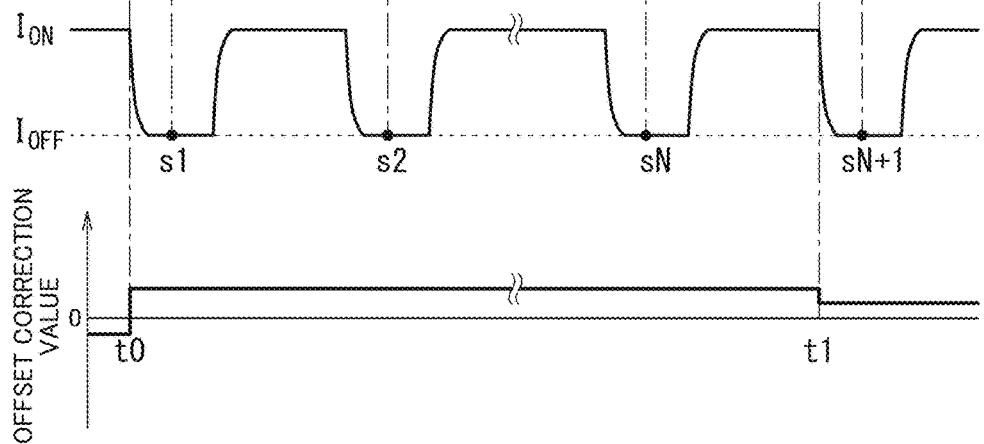
FIG. 7B
FIG. 7C
FIG. 8A
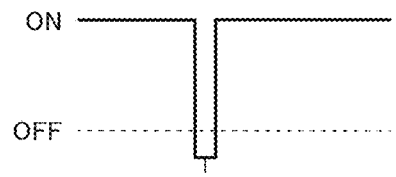
FIG. 8B
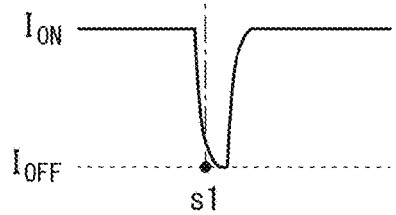

CURRENT DETECTION DEVICE, MOTOR CONTROL DEVICE, AND ELECTRIC POWER STEERING DEVICE

CROSS REFERENCE TO RELATED APPLICATIONS

This application is a National Stage of International Application No. PCT/JP2022/045301 filed Dec. 8, 2022, claiming priority based on Japanese Patent Application No. 2022-23749 filed Feb. 18, 2022.

TECHNICAL FIELD

The present invention relates to a current detection device, a motor control device, and an electric power steering device.

BACKGROUND ART

As means for driving an electric motor, pulse width modulation control (PWM) is known. In the PWM control, a switching element is turned on and off by a PWM signal of a duty ratio corresponding to a command value, and a voltage corresponding to the duty ratio is applied to the electric motor. Current flowing through the electric motor by the application of the voltage is detected by a current detector, and a difference between a target value and a current detection value is used as a deviation for generating the command value.

In this configuration, despite the current to be caused to flow through the electric motor being zero, there is a case where the detection value of current by the current detector is not zero. Such current is called offset current, and the detection current value detected by the current detector becomes a value acquired by adding the offset current to the current that actually flows through the electric motor. Thus, the offset current becomes a cause of occurrence of an error in the detection current value in the current detector.

If an offset error (i.e., an error due to offset current) occurs, since the detected current value does not coincide with the value of the current that actually flows through the electric motor, current control of the electric motor cannot be executed as designed. For example, in an electric power steering device that assists steering of a vehicle, if an offset error occurs during controlling an electric motor that generates steering assistance force, there is a case where a torque ripple occurs at a time of steering, and causes an unnatural feeling to a driver.

Thus, a power steering device of PTL 1 below includes current detection means for detecting current flowing through a switching element as current flowing through an electric motor; and correction means for correcting a detection value by the current detection means. The correction means acquires an offset correction value, based on a detection value of current detected by the current detection means in a period during which the switching element is off during PWM control, and corrects, by the offset correction value, the current detected by the current detection means in a period during which the switching element is on.

CITATION LIST

Patent Literature

PTL1: JP 4474896 B

SUMMARY OF INVENTION

Technical Problem

However, if the offset current occurring in the current detector that detects current flowing through the switching element is to be detected during PWM control, there is a case where the offset current cannot accurately be detected.

The present invention has been made by paying attention to the above problem, and the object of the present invention is to accurately detect, during PWM control, offset current occurring in a current detector that detects current flowing through a switching element of a multiphase inverter.

Solution to Problem

In order to achieve the above-described object, according to an aspect of the present invention, there is provided a current detection device including: a current detection unit configured to detect current flowing through a switching element of one arm of either an upper-side arm or a lower-side arm of a multiphase inverter on which PWM control is executed, based on a voltage drop of a resistor element connected in series to the switching element; a correction value calculation unit configured to calculate an offset correction value, based on a detection value of the current detected by the current detection unit in a period during which the switching element is off during the PWM control, and to hold and update the calculated offset correction value; and a correction unit configured to correct, by the offset correction value held by the correction value calculation unit, the detection value of the current detected by the current detection unit in a period during which the switching element is on,
   wherein the correction value calculation unit is configured to not update the offset correction value in a case where the switching element is the switching element of the lower-side arm and a duty ratio of the PWM control is equal to or less than a duty ratio lower limit value, or in a case where the switching element is the switching element of the upper-side arm and the duty ratio is equal to or greater than a duty ratio upper limit value.

According to another aspect of the present invention, there is provided a motor control device including: a multiphase inverter including a switching element; the current detection device described above, the current detection device being configured to detect current flowing through the switching element; and a controller configured to control the multiphase inverter, based on a detection current value by the current detection device.

According to still another aspect of the present invention, there is provided an electric power steering device including: the motor control device described above; and a multiphase motor configured to be controlled by the motor control device, wherein steering assistance effort force is given to a steering system of a vehicle by the multiphase motor.

Advantageous Effects of Invention

According to the present invention, it is possible to accurately detect, during PWM control, offset current occurring in a current detector that detects current flowing through a switching element of a multiphase inverter.

BRIEF DESCRIPTION OF DRAWINGS

FIG. 6 is a block diagram of an example of a current detection value correction unit;

FIG. 7A is a time chart illustrating an on period and an off period of a switching element of a lower-side arm, FIG. 7B is a schematic time chart of an output value of the current detection unit, and FIG. 7C is a schematic time chart of an offset correction value;

FIG. 8A is a time chart illustrating an on period and an off period of the lower-side arm in a case where a duty ratio is small, and FIG. 8B is a schematic time chart of an output value of the current detection unit;

DESCRIPTION OF EMBODIMENTS

Embodiments of the present invention will be described in detail with reference to the drawings. Note that the embodiments of the present invention to be described below indicate devices and methods to embody the technical idea of the present invention by way of example, and the technical idea of the present invention does not limit the constitution, arrangements, and the like of the constituent components to those described below. The technical idea of the present invention can be subjected to a variety of alterations within the technical scope prescribed by the claims described in CLAIMS.

(Configuration)

Figure 1:
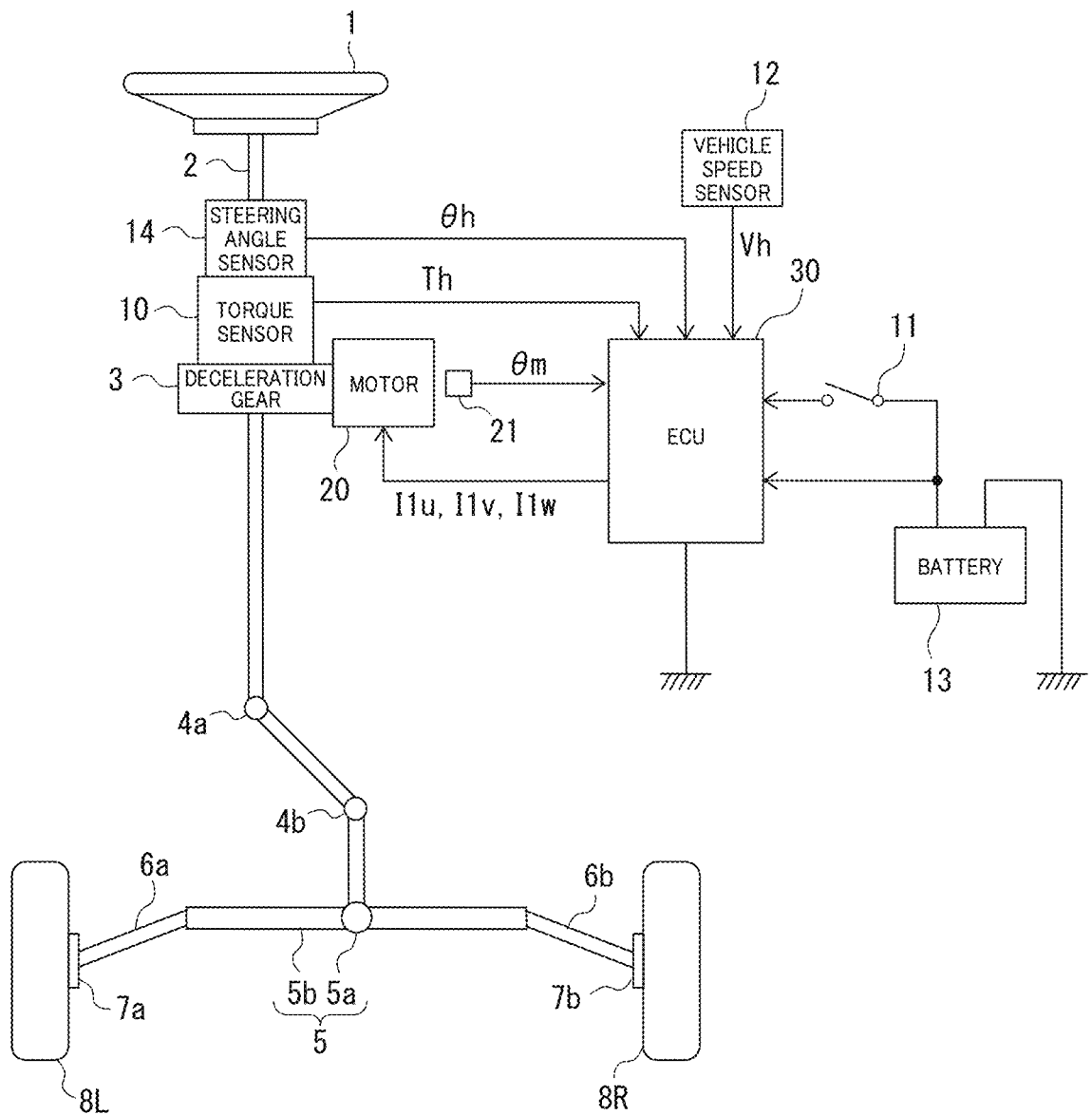
FIG. 1 is a configuration diagram illustrating an outline of an example of an electric power steering device of an embodiment.

FIG. 1 is a configuration diagram illustrating an outline of an example of an electric power steering (EPS) device of an embodiment. A steering shaft (handle shaft) 2 of a steering wheel (steering handle) 1 is coupled to steered vehicle wheels 8L and 8R via a deceleration gear (worm gear) 3 that constitutes a deceleration mechanism, universal joints 4a and 4b, a pinion-rack mechanism 5, and tie rods 6a and 6b, and further via hub units 7a and 7b.

The pinion-rack mechanism 5 includes a pinion 5a that is coupled to a pinion shaft, to which steering force is transmitted from the universal joint 4b, and a rack 5b that is meshed with the pinion 5a, and converts rotational motion that is transmitted to the pinion 5a into linear motion in a vehicle width direction by the rack 5b.

The steering shaft 2 is provided with a torque sensor 10 that detects a steering torque Th. In addition, the steering shaft 2 is provided with a steering angle sensor 14 that detects a steering angle θh of the steering wheel 1.

In addition, a motor 20 that assists the steering force of the steering wheel 1 is coupled to the steering shaft 2 via the deceleration gear 3. In the present specification, an example of a case where the motor 20 is a 3-phase motor is described, but the number of phases of the motor 20 may not be three.

Electric power is supplied from a battery 13 to an electronic control unit (ECU) 30 that controls the electric power steering device, and an ignition key signal is input to the ECU 30 via an ignition switch 11.

The ECU 30 calculates a current command value of an assist control command, based on a steering torque Th detected by the torque sensor 10, a vehicle speed Vh detected by a vehicle speed sensor 12 and a steering angle θh detected by the steering angle sensor 14, and controls electric current (U phase current I1u, V phase current I1v, W phase current I1w) that is supplied to the motor 20, by a voltage control command value acquired by applying compensation or the like to the current command value.

Note that the steering angle sensor 14 is not indispensable, and the steering angle θh may be calculated by adding an angle of torsion of a torsion bar of the torque sensor 10 to a motor rotational angle θm acquired from a rotational angle sensor 21 that detects a rotational angle of a rotational shaft of the motor 20.

In addition, in place of the steering angle θh, a turning angle of the steered vehicle wheel 8L, 8R may be used. For example, the turning angle may be detected by detecting a displacement amount of the rack 5b.

The ECU 30 includes a computer that includes, for example, a processor, and peripheral components such as a storage device. The processor may be, for example, a CPU (Central Processing Unit) or an MPU (Micro-Processing Unit).

The storage device may include one of a semiconductor storage device, a magnetic storage device and an optical storage device. The storage device may include a register, a cache memory, memories such as a ROM (Read Only Memory) and a RAM (Random Access Memory) used as a main storage device.

Functions of the ECU 30 to be described below are implemented, for example, by the processor of the ECU 30 executing a computer program stored in the storage device.

Note that the ECU 30 may be constituted by dedicated hardware for executing various information processes to be described below.

For example, the ECU 30 may include a functional logical circuit that is set in a general-purpose semiconductor integrated circuit. For example, the ECU 30 may include a programmable logic device (PLD) such as a field programmable gate array (FPGA).

Figure 2:
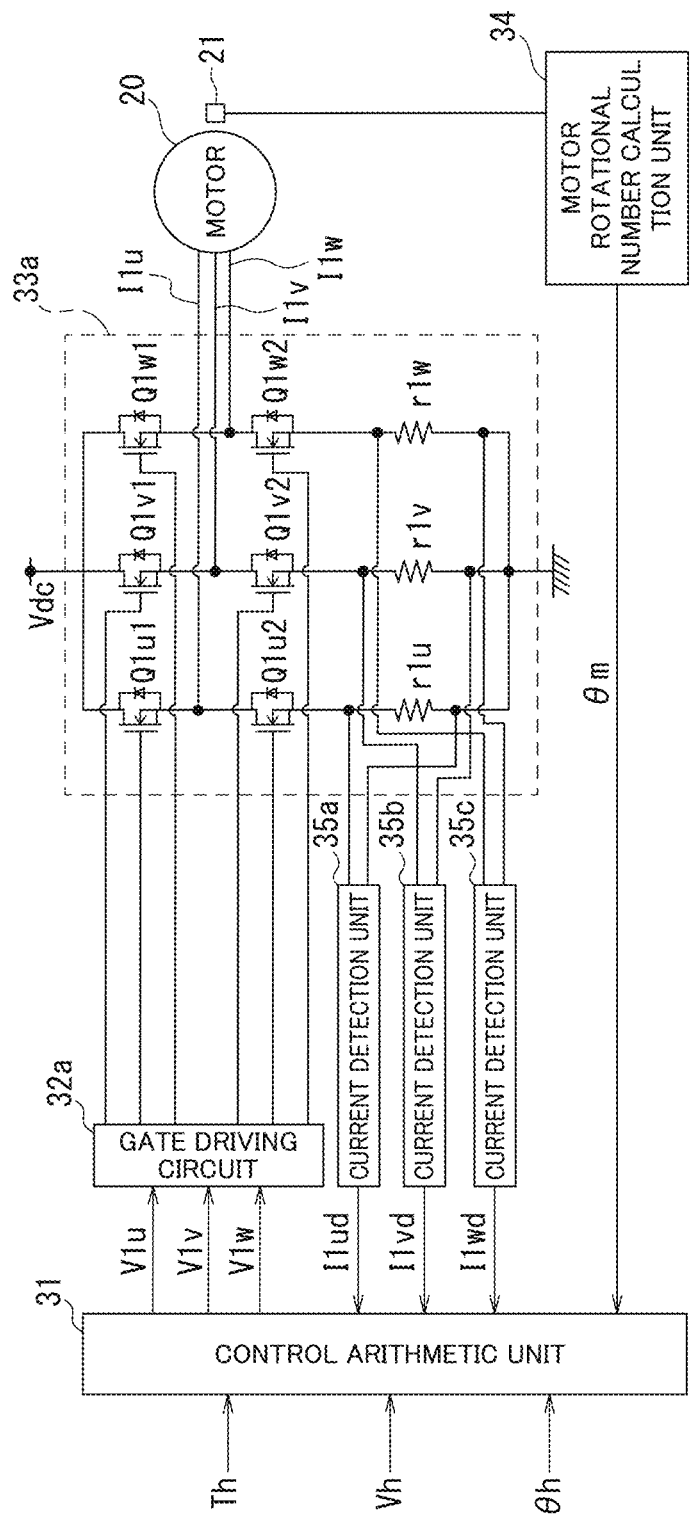
FIG. 2 is a configuration diagram illustrating an outline of an example of an electronic control unit (ECU)

FIG. 2 is a configuration diagram illustrating an outline of an example of the ECU 30 of the embodiment. The ECU 30 includes a control arithmetic unit 31, a gate driving circuit 32a, an inverter 33a, a motor rotational number calculation unit 34, and current detection units 35a to 35c.

The control arithmetic unit 31 calculates a current command value that is a control target value of a driving current of the motor 20, based on at least the steering torque Th, and outputs to the gate driving circuit 32a a voltage control command value V1u, V1v, V1w acquired by applying compensation or the like to the current command value. The voltage control command values V1u, V1v, and V1w are a U phase voltage control command value of a U phase coil, a V phase voltage control command value of a V phase coil, and a W phase voltage control command value of a W phase coil, respectively.

The gate driving circuit 32a calculates duty ratios Du, Dv and Dw of PWM signals that drive the U phase coil, V phase coil and W phase coil, based on the voltage control command values V1u, V1v and V1w. The gate driving circuit 32a outputs PWM signals according to the calculated duty ratios Du, Dv and Dw to the inverter 33a.

The inverter 33a includes a three-phase bridge connected between a positive-side line, which is connected to a DC power supply Vdc and to which DC power is supplied, and a ground line.

The three-phase bridge includes switching element pairs in which switching elements Q1u1, Q1v1 and Q1w1 of an upper-side arm of the U phase, V phase and W phase and switching elements Q1u2, Q1v2 and Q1w2 of a lower-side arm of the U phase, V phase and W phase are connected in series, respectively. The U phase current I1u that is supplied to the U phase coil of the motor 20 is supplied from a connection node of the switching elements Q1u1 and Q1u2, the V phase current I1v that is supplied to the V phase coil is supplied from a connection node of the switching elements Q1v1 and Q1v2, and the W phase current I1w that is supplied to the W phase coil is supplied from a connection node of the switching elements Q1w1 and Q1w2.

Shunt resistors r1u, r1v and r1w are connected in series between the switching elements Q1u2, Q1v2 and Q1w2 of the lower-side arm of the U phase, V phase and W phase and the ground line. The current detection units 35a to 35c to be described later can detect current flowing in the switching elements Q1u2, Q1v2 and Q1w2 of the lower-side arm by detecting voltage drops occurring in the shunt resistors r1u, r1v and r1w.

Note that the shunt resistors r1u, r1v and r1w may be provided between the switching elements Q1u1, Q1v1 and Q1w1 of the upper-side arm of the U phase, V phase and W phase and the positive-side line, and the current detection units 35a to 35c may detect current flowing through the switching elements Q1u1, Q1v1 and Q1w1 of the upper-side arm.

The motor rotational number calculation unit 34 calculates the motor rotational angle θm (for example, a motor electric angle) of the motor 20, based on a detection signal of the rotational angle sensor 21, and outputs the motor rotational angle θm to the control arithmetic unit 31.

The current detection units 35a to 35c output detection values I1ud, I1vd and I1wd of current flowing through the switching elements Q1u2, Q1v2 and Q1w2 of the lower-side arm, based on voltage drops occurring in the shunt resistors r1u, r1v and r1w.

Figure 4:
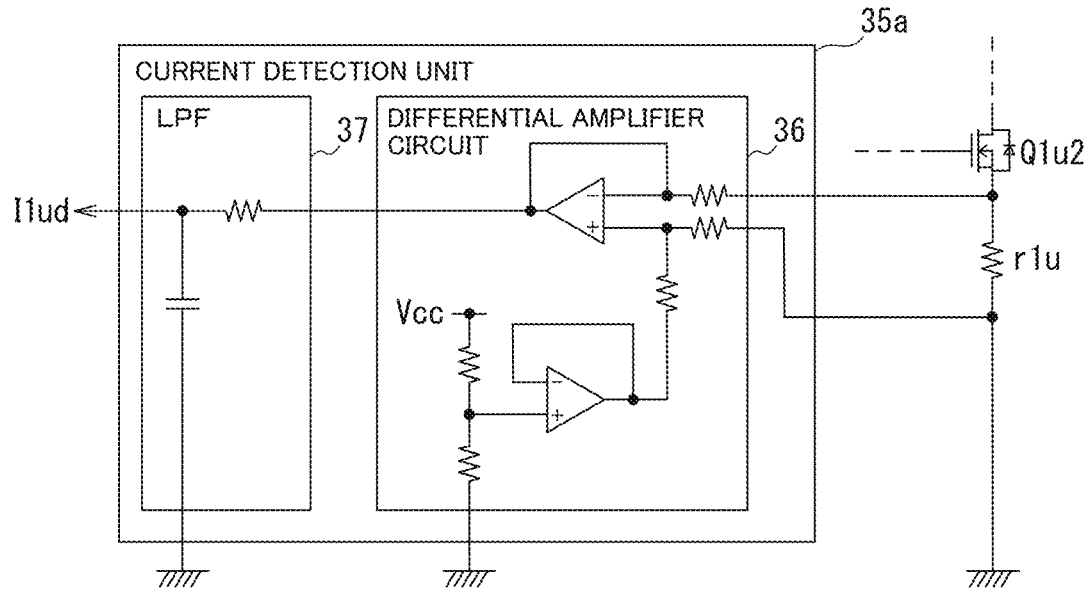
FIG. 4 is a circuit diagram illustrating an example of a configuration of a current detection unit.

FIG. 4 is a circuit diagram illustrating an example of a configuration of the current detection unit 35a. The current detection unit 35a includes a differential amplifier circuit 36 that generates a current detection signal corresponding to the magnitude of the voltage drop occurring in the shunt resistor r1u, and a low-pass filter (LPF) 37 connected to an output of the differential amplifier circuit 36. The same applies to the current detection units 35b and 35c. Note that in FIG. 4, Vcc is a predetermined voltage generated by a power supply generation circuit, and may be, for example, 5 [V].

In the current detection unit 35a of this configuration, even if the voltage drop occurring in the shunt resistor r1u is zero (i.e., the current flowing through the shunt resistor r1u is zero), there is a case where the detection value by the current detection unit 35a does not become zero (i.e., the detection value includes an offset current).

Such an offset current occurs due to, for example, aging degradation of the differential amplifier circuit 36 or a temperature variation of the current detection unit 35a.

Figure 3:
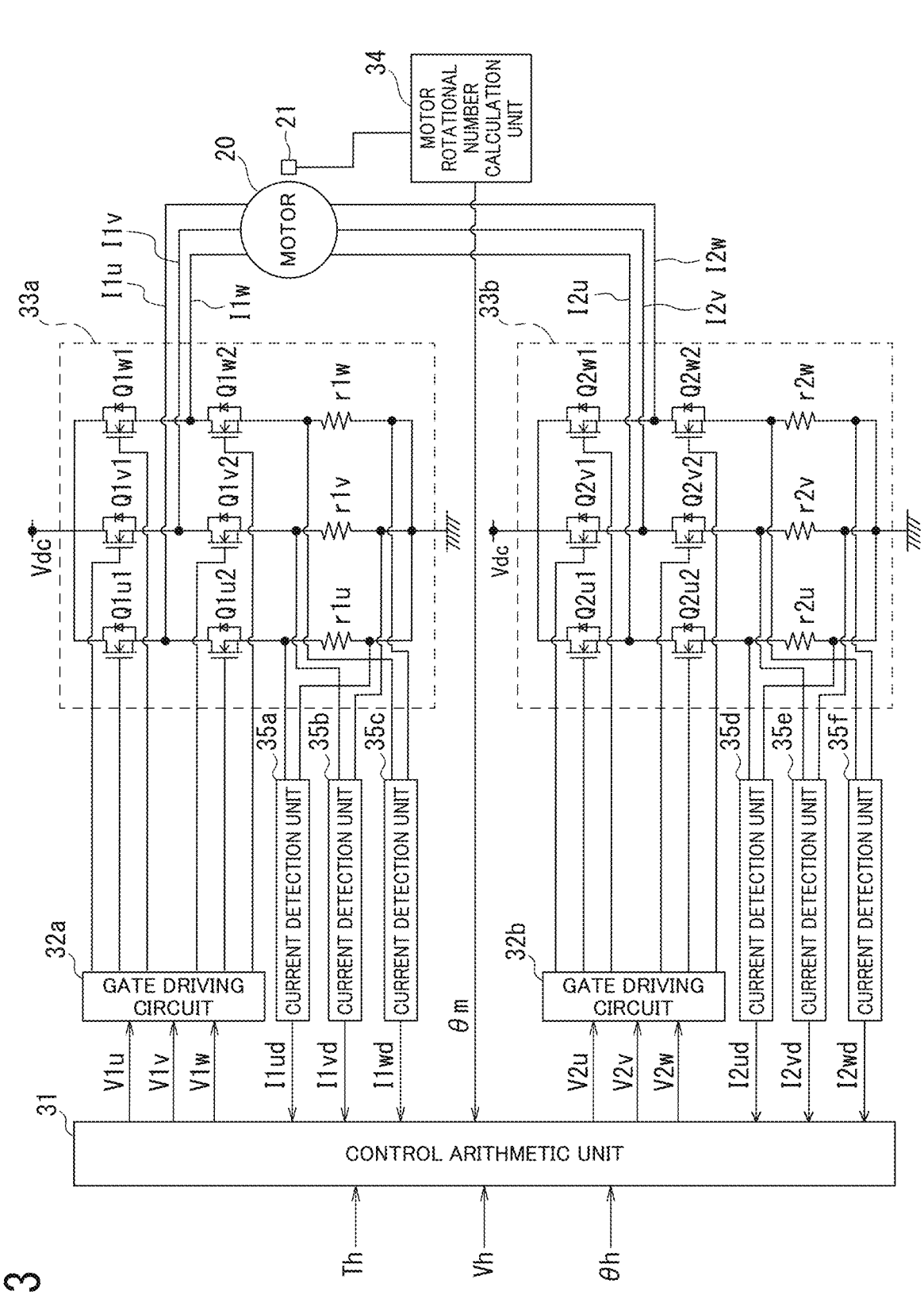
FIG. 3 is a configuration diagram illustrating an outline of another example of the electronic control unit (ECU)

FIG. 3 is a configuration diagram illustrating an outline of another example of the ECU 30 of the embodiment. The ECU 30 of FIG. 3 controls a double-winding motor as the motor 20. The double-winding motor includes such a double winding that a first system coil and a second system coil are wound in an identical motor housing and a common rotor is rotated by the coils of the two systems. The ECU 30 includes a control arithmetic unit 31; a first system gate driving circuit 32a and a first system inverter 33a that drive the first system coil of the motor 20; a second system gate driving circuit 32b and a second system inverter 33b that drive the second system coil; a motor rotational number calculation unit 34; and current detection units 35a to 35f. The configuration of the motor rotational number calculation unit 34 of FIG. 3 is similar to the configuration of the motor rotational number calculation unit 34 of FIG. 2.

The control arithmetic unit 31 calculates current command values that are control target values of a driving current of the motor 20, based on at least the steering torque Th, and outputs to the first system gate driving circuit 32a and second system gate driving circuit 32b voltage control command values V1u, V1v, V1w, V2u, V2v, and V2w acquired by applying compensation or the like to the current command values. The voltage control command values V1u, V1v, and V1w are a U phase voltage control command value, a V phase voltage command value and a W phase voltage command value of the first system coil, respectively, and the voltage control command values V2u, V2v, and V2w are a U phase voltage control command value, a V phase voltage command value and a W phase voltage command value of the second system coil, respectively.

The first system gate driving circuit 32a calculates duty ratios Du, Dv and Dw of the U phase, V phase and W phase of PWM signals that drive the first system coil, based on the voltage control command values V1u, V1v and V1w. The gate driving circuit 32a outputs PWM signals according to the calculated duty ratios Du, Dv and Dw to the first system inverter 33a.

The configurations of the first system gate driving circuit 32a, first system inverter 33a and current detection units 35a to 35c of FIG. 3 are similar to the configurations of the driving circuit 32a, inverter 33a and current detection units 35a to 35c of FIG. 2.

The second system gate driving circuit 32b calculates duty ratios Du, Dv and Dw of the U phase, V phase and W phase of PWM signals that drive the second system coil, based on the voltage control command values V2u, V2v and V2w. The second system gate driving circuit 32b outputs PWM signals according to the calculated duty ratios Du, Dv and Dw to the second system inverter 33b.

The second system inverter 33b includes a three-phase bridge connected between a positive-side line, which is connected to a DC power supply Vdc and to which DC power is supplied, and a ground line.

The three-phase bridge includes switching element pairs in which switching elements Q2u1, Q2v1 and Q2w1 of an upper-side arm of the U phase, V phase and W phase and switching elements Q2u2, Q2v2 and Q2w2 of a lower-side arm of the U phase, V phase and W phase are connected in series, respectively. U phase current I2u that is supplied to the second system coil of the motor 20 is supplied from a connection node of the switching elements Q2u1 and Q2u2, V phase current I2v is supplied from a connection node of the switching elements Q2v1 and Q2v2, and W phase current I2w is supplied from a connection node of the switching elements Q2w1 and Q2w2.

Shunt resistors r2u, r2v and r2w are connected in series between the switching elements Q2u2, Q2v2 and Q2w2 of the lower-side arm of the U phase, V phase and W phase and the ground line. Current detection units 35d to 35f to be described later can detect current flowing through the switching elements Q2u2, Q2v2 and Q2w2 of the lower-side arm by detecting voltage drops occurring in the shunt resistors r2u, r2v and r2w.

Note that the shunt resistors r2u, r2v and r2w may be provided between the switching elements Q2u1, Q2v1 and Q2w1 of the upper-side arm of the U phase, V phase and W phase and the positive-side line, and the current detection units 35d to 35f may detect current flowing through the switching elements Q2u1, Q2v1 and Q2w1 of the upper-side arm.

The current detection units 35d to 35f output detection values I2ud, I2vd and I2wd of current flowing through the switching elements Q2u2, Q2v2 and Q2w2 of the lower-side arm, based on voltage drops occurring in the shunt resistors r2u, r2v and r2w. The configurations of the current detection units 35d to 35f are similar to the configuration of the current detection unit 35a described with reference to FIG. 4.

Figure 5:
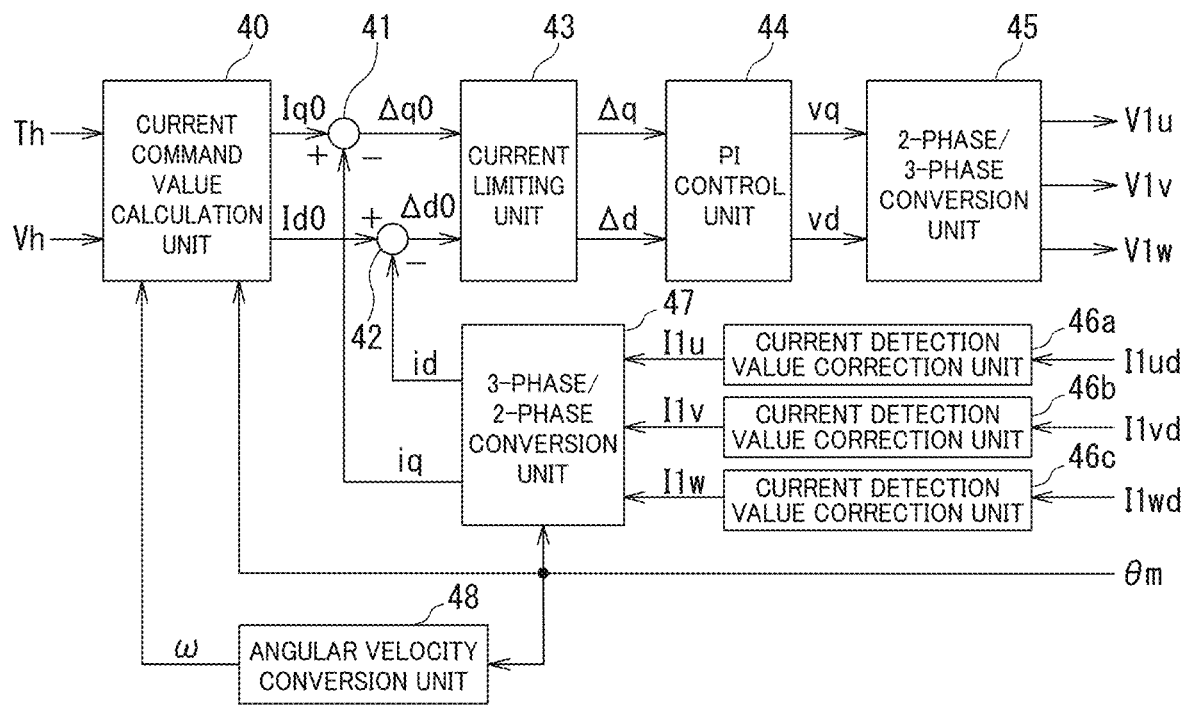
FIG. 5 is a block diagram of an example of a functional configuration of a control arithmetic unit.

FIG. 5 is a block diagram of an example of a functional configuration of the control arithmetic unit 31. Note that in the description below, only the functional configuration for controlling the inverter 33a of a single system is described. In the configuration including the inverters 33a and 33b of the two systems as in FIG. 3, the functional configuration described below is individually provided for each of the inverters of the two systems.

The control arithmetic unit 31 includes a current command value calculation unit 40, subtractors 41 and 42, a current limiting unit 43, a proportional-integral (PI) control unit 44, a 2-phase/3-phase conversion unit 45, current detection value correction units 46a to 46c, a 3-phase/2-phase conversion unit 47, and an angular velocity conversion unit 48, and drives the motor 20 by vector control.

The current command value calculation unit 40 calculates a q-axis current command value Iq0 and a d-axis current command value Id0 that are to be caused to flow through the motor 20, based on the steering torque Th, vehicle speed Vh, motor rotational angle θm of the motor 20, and a rotational angular velocity ω of the motor 20.

On the other hand, the detection values I1ud, I1vd and I1wd of the U phase current, V phase current and W phase current of the motor 20 by the current detection units 35a to 35c are input to the current detection value correction units 46a to 46c.

The current detection value correction units 46a to 46c calculate the U phase current I1u, V phase current I1v and W phase current I1w, by performing correction for removing offset current from the detection values I1ud, I1vd and I1wd. The configurations and operations of the current detection value correction units 46a to 46c will be described later.

The U phase current I1u, V phase current I1v and W phase current I1w are converted into d-q two-axis currents id and iq by the 3-phase/2-phase conversion unit 47.

The subtractors 41 and 42 calculate q-axis deviation current Δq0 and d-axis deviation current Δd0 by subtracting the fed-back currents iq and id from the q-axis current command value Iq0 and d-axis current command value Id0, respectively.

The current limiting unit 43 limits upper limit values of the q-axis deviation current Δq0 and d-axis deviation current Δd0. A q-axis deviation current Δq and a d-axis deviation current Δd after the limiting are input to the PI control unit 44.

The PI control unit 44 calculates such voltage command values vq and vd as to set the q-axis deviation current Δq and d-axis deviation current Δd to zero. The 2-phase/3-phase conversion unit 45 converts the voltage command values vd and vq into the U phase voltage control command value V1u, V phase voltage control command value V1v and W phase voltage control command value V1w and output them to the gate driving circuit 32a.

The angular velocity conversion unit 48 calculates the rotational angular velocity ω of the motor 20, based on a variation with time of the motor rotational angle θm. The motor rotational angle θm and the rotational angular velocity ω are input to the current command value calculation unit 40 and used for vector control.

FIG. 6 is a block diagram of an example of the current detection value correction unit 46a. The current detection value correction units 46b and 46c include the same configuration as the current detection value correction unit 46a. The current detection value correction unit 46a includes a scale conversion unit 50a, a correction value calculation unit 50b, a subtracter 50c, a gain correction value storage unit 50d, and a multiplier 50e.

The scale conversion unit 50a converts into a current value the detection value I1ud that is output from the current detection unit 35a, which detects the U phase current, and is converted into a digital form. For example, the scale conversion unit 50a may convert the detection value I1ud into a current value by multiplying the detection value I1ud by a predetermined coefficient.

The correction value calculation unit 50b dynamically calculates, during PWM control by the ECU 30, an offset correction value for correcting an offset error (i.e., an error due to offset current) occurring in the current detection unit 35a, and holds and updates the calculated offset correction value. Specifically, the correction value calculation unit 50b calculates the offset error periodically or, as needed, during PWM control, and updates the previously calculated and held offset error with a newly calculated offset error.

The correction value calculation unit 50b calculates the offset correction value, based on the detection value I1ud of current detected by the current detection unit 35a in a period during which the switching element Q1u2 of the lower-side arm of the U phase is off. For example, the detection value I1ud of current detected by the current detection unit 35a in a period, during which the switching element Q1u2 is off, may be set as the offset correction value.

For example, the correction value calculation unit 50b may calculate, as the offset correction value, an average of detection values that the current detection unit 35a outputs N times in a period during which the switching element Q1u2 is off, during a period of a predetermined length (hereinafter also referred to as "detection value collection period P") during which the detection value I1ud is collected (N is a natural number of 1 or more). In this case, the correction value calculation unit 50b updates the held offset correction value with a newly calculated offset correction value in every detection value collection period P.

For example, if it is assumed that the length of the detection value collection period P is one second [sec] and a cycle, in which the correction value calculation unit 50b acquires the output of the current detection unit 35a in the period during which the switching element Q1u2 is off, is 1 [ms], an average of 1000 detection values may be calculated as the offset correction value.

Note that the correction value calculation unit 50b may acquire the output of the current detection unit 35a in every PWM cycle, or may acquire the output of the current detection unit 35a in every plural cycles of the PWM cycle.

FIG. 7A is a time chart illustrating an on period and an off period of the switching element Q1u2, FIG. 7B is a schematic time chart of the output value I1ud of the current detection unit 35a, and FIG. 7C is a schematic time chart of the offset correction value. Output values $I_{ON}$ and $I_{OFF}$ of FIG. 7B are a steady-state value of the output value I1$ud$ in the on period of the switching element Q1$u$2, and a steady-state value of the output value I1$ud$ in the off period of the switching element Q1$u$2.

The correction value calculation unit 50$b$ may acquire the output value I1$ud$ of the current detection unit 35$a$ at each of sampling times s1, s2, . . . , sN in one detection value collection period P that starts at time to and ends at time t1, and may calculate an average of the acquired N output values I1$ud$ as the offset correction value.

Note that the sampling time s1, s2, . . . , sN may be set, for example, at a time of the center of the off period $P_{OFF}$ of the switching element Q1$u$2.

FIG. 8A is a time chart illustrating an on period and an off period of the switching element Q1$u$2 of the lower-side arm of the U phase in a case where a duty ratio Du of the U phase is small, and FIG. 8B is a schematic time chart of an output value of the current detection unit 35$a$.

As illustrated in FIG. 4, the LPF 37 is disposed at an output part of the current detection unit 35$a$. Thus, at a time of switching of the switching element Q1$u$2, a rounding occurs in the waveform of the output value of the current detection unit 35$a$, as illustrated in FIG. 7B and FIG. 8B.

Accordingly, in a case where the duty ratio Du of the U phase is small, there is a case in which the detection value I1$ud$ of an off period 'a' cannot properly be sampled. For example, if the detection value I1$ud$ of the current detection unit 35$a$ is sampled at sampling time s1 illustrated in FIG. 8B, a detection value greater than a steady-state value $I_{OFF}$ in the off period is sampled.

Thus, the correction value calculation unit 50$b$ stops update of the offset correction value of the U phase in a case where the duty ratio Du of the U phase is equal to or less than a lower limit value Dth (for example, 14%) (in other words, in a case where the duty ratio Du is equal to or less than the lower limit value Dth, the offset correction value of the U phase is not updated). For example, if it is detected that the duty ratio Du of the U phase has decreased to the lower limit value Dth or less at any one of times during a certain detection value collection period P, the correction value calculation unit 50$b$ sets a duty decrease detection flag F1 from off to on. If the duty decrease detection flag F1 is on at a time when the detection value collection period P terminates, the correction value calculation unit 50$b$ stops updating the currently held offset correction value of the U phase with an offset correction value calculated based on the detection value I1$ud$ collected in the detection value collection period P (in other words, the update is not performed). The correction value calculation unit 50$b$ may receive duty information relating to the duty ratios Du, Dv and Dw from the gate driving circuit 32$a$.

Similarly, in the current detection value correction unit 46$b$ of the V phase, if the duty ratio Dv of the V phase is equal to or less than a lower limit value Dth, the update of the offset correction value of the V phase is stopped (in other words, in a case where the duty ratio Dv is equal to or less than the lower limit value Dth, the offset correction value of the V phase is not updated), and also in the current detection value correction unit 46$c$ of the W phase, if the duty ratio Dw of the W phase is equal to or less than a lower limit value Dth, the update of the offset correction value of the W phase is stopped (in other words, in a case where the duty ratio Dw is equal to or less than the lower limit value Dth, the offset correction value of the W phase is not updated).

In addition, for example, even in a case where the duty ratio Du of the U phase is greater than the lower limit value Dth, if the duty ratio Dv of the V phase or the duty ratio Dw of the W phase is equal to or less than the lower limit value Dth, the correction value calculation unit 50$b$ may stop the update of the offset correction value of the U phase (in other words, even in a case where the duty ratio Du is greater than the lower limit value Dth, if the duty ratio Dv or the duty ratio Dw is equal to or less than the lower limit value Dth, the offset correction value of the U phase is not updated). The reason for this is that in the case where the duty ratio Dv of the V phase or the duty ratio Dw of the W phase is small, since a time when the correction value calculation unit 50$b$ acquires the detection value I1$ud$ of the current detection unit 35$a$ becomes close to a time of on/off switching of the switching element in the V phase or W phase, there is concern that the detection value I1$ud$ is affected by noise due to switching.

For example, if the correction value calculation unit 50$b$ detects that the duty ratio Dv or Dw has decreased to the lower limit value Dth or less at any one of times during a certain detection value collection period P, the correction value calculation unit 50$b$ sets the duty decrease detection flag F1 from off to on. If the duty decrease detection flag F1 is on at a time when the detection value collection period P terminates, the correction value calculation unit 50$b$ stops updating the currently held offset correction value of the U phase with an offset correction value calculated based on the detection value I1$ud$ collected in the detection value collection period P (in other words, the currently held offset correction value of the U phase is not updated with an offset correction value calculated based on the detection value I1$ud$ collected in the detection value collection period P).

Similarly, in the current detection value correction unit 46$b$ of the V phase, even in a case where the duty ratio Dv of the V phase is greater than the lower limit value Dth, if the duty ratio Du of the U phase or the duty ratio Dw of the W phase is equal to or less than the lower limit value Dth, the update of the offset correction value of the V phase may be stopped (in other words, even in a case where the duty ratio Dv is greater than the lower limit value Dth, if the duty ratio Du or Dw is equal to or less than the lower limit value Dth, the offset correction value of the V phase is not updated). Besides, in the current detection value correction unit 46$c$ of the W phase, even in a case where the duty ratio Dw of the W phase is greater than the lower limit value Dth, if the duty ratio Du of the U phase or the duty ratio Dv of the V phase is equal to or less than the lower limit value Dth, the update of the offset correction value of the W phase may be stopped (in other words, even in a case where the duty ratio Dw is greater than the lower limit value Dth, if the duty ratio Du or Dv is equal to or less than the lower limit value Dth, the offset correction value of the W phase is not updated).

Note that in a case where the shunt resistors r1$u$, r1$v$ and r1$w$ are provided between the switching elements of the upper-side arm of the U phase, V phase and W phase and the positive-side line, the update of the offset correction value is stopped if the duty ratio is equal to or greater than an upper limit value (in other words, if the duty ratio is equal to or greater than the upper limit value, the offset correction value is not updated).

In addition, in a case where the detection value I1$ud$ of current detected by the current detection unit 35$a$ in a period during which the switching element Q1$u$2 is off exceeds an upper limit value Ith, the correction value calculation unit 50$b$ may prohibit the update of the offset correction value of the U phase by the detection value I1$ud$ (in other words, in a case where the detection value I1$ud$ exceeds the upper limit value Ith, the offset correction value of the U phase is not updated by the detection value I1ud). The upper limit value Ith may be set as appropriate, for example, at a magnitude (for example, 1 ampere) at which the occurrence as offset current cannot be assumed.

For example, if the correction value calculation unit 50b detects that the detection value I1ud exceeds the upper limit value Ith at any one of times during a certain detection value collection period P, the correction value calculation unit 50b sets a U phase abnormal value detection flag F2u from off to on. If the U phase abnormal value detection flag F2u is on at a time when the detection value collection period P terminates, the correction value calculation unit 50b stops updating the currently held offset correction value of the U phase with an offset correction value calculated based on the detection value I1ud collected in the detection value collection period P (in other words, the currently held offset correction value of the U phase is not updated with an offset correction value calculated based on the detection value I1ud collected in the detection value collection period P).

Note that even in a case where the detection value I1vd of current detected by the current detection unit 35b in a period during which the switching element Q1v2 of the V phase is off exceeds the upper limit value Ith, or even in a case where the detection value I1wd of current detected by the current detection unit 35c in a period during which the switching element Q1w2 of the W phase is off exceeds the upper limit value Ith, the correction value calculation unit 50b may not prohibit the update of the offset correction value of the U phase (in other words, even in a case where the detection value I1vd exceeds the upper limit value Ith, or even in a case where the detection value I1wd exceeds the upper limit value Ith, the offset correction value of the U phase may be updated). The reason for this is that even if an abnormal value is detected in the V phase or W phase, if an abnormal value is not detected in the U phase, there is no problem with the calculation of the offset correction value.

Similarly, in the current detection value correction unit 46b of the V phase, if it is detected that the detection value I1vd of the current detection unit 35b exceeds the upper limit value Ith, a V phase abnormal value detection flag F2v may be set from off to on, and the update of the offset correction value of the V phase by the detection value I1vd exceeding the upper limit value Ith may be prohibited (in other words, the offset correction value of the V phase is not updated by the detection value I1vd exceeding the upper limit value Ith). Besides, in the current detection value correction unit 46c of the W phase, if it is detected that the detection value I1wd of the current detection unit 35c exceeds the upper limit value Ith, a W phase abnormal value detection flag F2w may be set from off to on, and the update of the offset correction value of the W phase by the detection value I1wd exceeding the upper limit value Ith may be prohibited (in other words, the offset correction value of the W phase is not updated by the detection value I1wd exceeding the upper limit value Ith).

FIG. 6 is referred to. The subtracter 50c corrects the detection value I1ud by subtracting the offset correction value held in the correction value calculation unit 50b, from the detection value I1ud of current detected by the current detection unit 35a in the period during which the switching element Q1u2 is on.

The multiplier 50e outputs, as U phase current I1u after correction, a product acquired by multiplying the subtraction result by the correction value calculation unit 50b by a predetermined gain stored in the gain correction value storage unit 50d.

Figure 9:
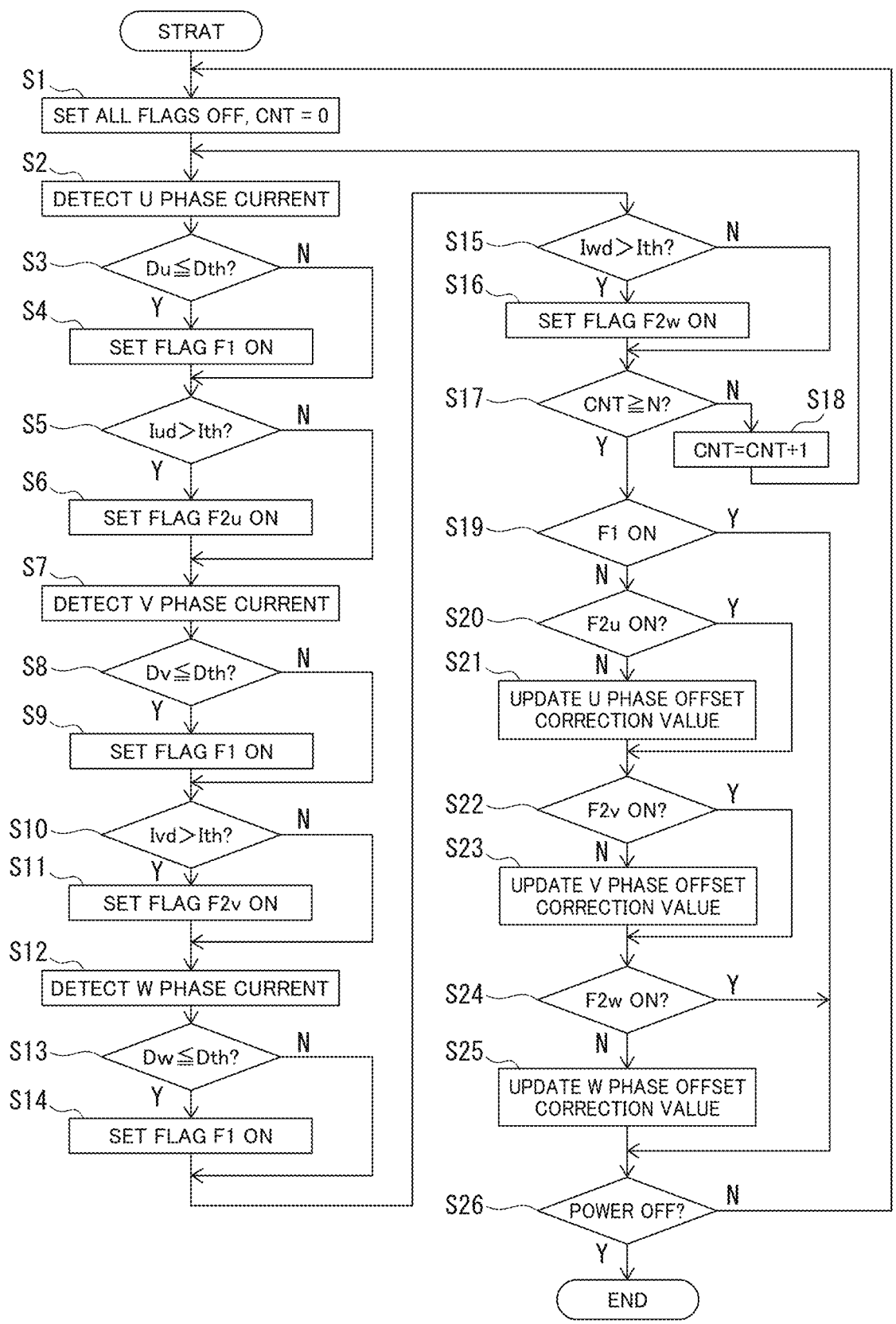
FIG. 9 is a flowchart of an example of a setting method of the offset correction value.

FIG. 9 is a flowchart of an example of a setting method of the offset correction values in the current detection value correction units 46a to 46c. Note that in the description of the flowchart below, the detection value I1ud of the current detection unit 35a of the U phase of the first system and the detection value I2ud of the current detection unit 35d of the U phase of the second system are generally referred to as "detection value Iud", the detection value I1vd of the current detection unit 35b of the V phase of the first system and the detection value I2vd of the current detection unit 35e of the V phase of the second system are generally referred to as "detection value Ivd", and the detection value I1wd of the current detection unit 35c of the W phase of the first system and the detection value I2wd of the current detection unit 35f of the W phase of the second system are generally referred to as "detection value Iwd".

In step S1, the duty decrease detection flag F1, U phase abnormal value detection flag F2u, V phase abnormal value detection flag F2v, and W phase abnormal value detection flag F2w are set off. In addition, the value of a count variable CNT is initialized to 0.

In step S2, the detection value Iud of the U phase is detected.

In step S3, it is determined whether the duty ratio Du of the U phase is equal to or less than the lower limit value Dth. If the duty ratio Du of the U phase is equal to or less than the lower limit value Dth (step S3: Y), the process advances to step S4. If the duty ratio Du of the U phase is not equal to or less than the lower limit value Dth (step S3: N), the process advances to step S5.

In step S4, the duty decrease detection flag F1 is set on. Then, the process advances to step S5.

In step S5, it is determined whether the detection value Iud of the U phase exceeds the upper limit value Ith. If the detection value Iud of the U phase exceeds the upper limit value Ith (step S5: Y), the process advances to step S6. If the detection value Iud of the U phase does not exceed the upper limit value Ith (step S5: N), the process advances to step S7.

In step S6, the U phase abnormal value detection flag F2u is set on. Then, the process advances to step S7.

In step S7, the detection value Ivd of the V phase is detected.

In step S8, it is determined whether the duty ratio Dv of the V phase is equal to or less than the lower limit value Dth. If the duty ratio Dv of the V phase is equal to or less than the lower limit value Dth (step S8: Y), the process advances to step S9. If the duty ratio Dv of the V phase is not equal to or less than the lower limit value Dth (step S8: N), the process advances to step S10.

In step S9, the duty decrease detection flag F1 is set on. Then, the process advances to step S10.

In step S10, it is determined whether the detection value Ivd of the V phase exceeds the upper limit value Ith. If the detection value Ivd of the V phase exceeds the upper limit value Ith (step S10: Y), the process advances to step S11. If the detection value Ivd of the V phase does not exceed the upper limit value Ith (step S10: N), the process advances to step S12.

In step S11, the V phase abnormal value detection flag F2v is set on. Then, the process advances to step S12.

In step S12, the detection value Iwd of the W phase is detected.

In step S13, it is determined whether the duty ratio Dw of the W phase is equal to or less than the lower limit value Dth. If the duty ratio Dw of the W phase is equal to or less than the lower limit value Dth (step S13: Y), the process advances to step S14. If the duty ratio Dw of the W phase is not equal to or less than the lower limit value Dth (step S13: N), the process advances to step S15.

In step S14, the duty decrease detection flag F1 is set on. Then, the process advances to step S15.

In step S15, it is determined whether the detection value Iwd of the W phase exceeds the upper limit value Ith. If the detection value Iwd of the W phase exceeds the upper limit value Ith (step S15: Y), the process advances to step S16. If the detection value Iwd of the W phase does not exceed the upper limit value Ith (step S15: N), the process advances to step S17.

In step S16, the W phase abnormal value detection flag F2w is set on. Then, the process advances to step S17.

In step S17, it is determined whether the count variable CNT is equal to or greater than N. If the count variable CNT is equal to or greater than N (step S17: Y), it is determined that one detection value collection period P has terminated, and the process advances to step S19. If the count variable CNT is not equal to or greater than N (step S17: N), the process advances to step S18.

In step S18, the value of the count variable CNT is incremented by one, and the process returns to step S2.

In step S19, it is determined whether the duty decrease detection flag F1 is on. If the duty decrease detection flag F1 is on (step S19: Y), the process advances to step S26. In this case, none of the offset correction value of the U phase, the offset correction value of the V phase and the offset correction value of the W phase is updated.

If the duty decrease detection flag F1 is not on (step S19: N), the process advances to step S20.

In step S20, it is determined whether the U phase abnormal value detection flag F2u is on. If the U phase abnormal value detection flag F2u is on (step S20: Y), the process advances to step S22. In this case, the offset correction value of the U phase is not updated. If the U phase abnormal value detection flag F2u is not on (step S20: N), the process advances to step S21.

In step S21, a new offset correction value of the U phase is calculated, and the currently held offset correction value is updated. Then, the process advances to step S22.

In step S22, it is determined whether the V phase abnormal value detection flag F2v is on. If the V phase abnormal value detection flag F2v is on (step S22: Y), the process advances to step S24. In this case, the offset correction value of the V phase is not updated. If the V phase abnormal value detection flag F2v is not on (step S22: N), the process advances to step S23.

In step S23, a new offset correction value of the V phase is calculated, and the currently held offset correction value is updated. Then, the process advances to step S24.

In step S24, it is determined whether the W phase abnormal value detection flag F2w is on. If the W phase abnormal value detection flag F2w is on (step S24: Y), the process advances to step S26. In this case, the offset correction value of the W phase is not updated. If the W phase abnormal value detection flag F2w is not on (step S24: N), the process advances to step S25.

In step S25, a new offset correction value of the W phase is calculated, and the currently held offset correction value is updated. Then, the process advances to step S26.

In step S26, it is determined whether the ignition switch 11 is turned off. If the ignition switch 11 is turned off (step S26: Y), the process ends. If the ignition switch 11 is not off (step S26: N), the process returns to step S1.

(Modifications)

In the above description, the example was described in which the current detection device of the present invention is applied to the electric power steering device of a column assist method that is a so-called upstream assist method, but the current detection device of the present invention may be applied to an electric power steering device of a so-called downstream assist method. Hereinafter, a configuration example is described in which the current detection device of the present invention is applied to electric power steering devices of a single pinion assist method, a rack assist method and a dual pinion assist method, as examples of the electric power steering device of the downstream assist method.

Figure 10:
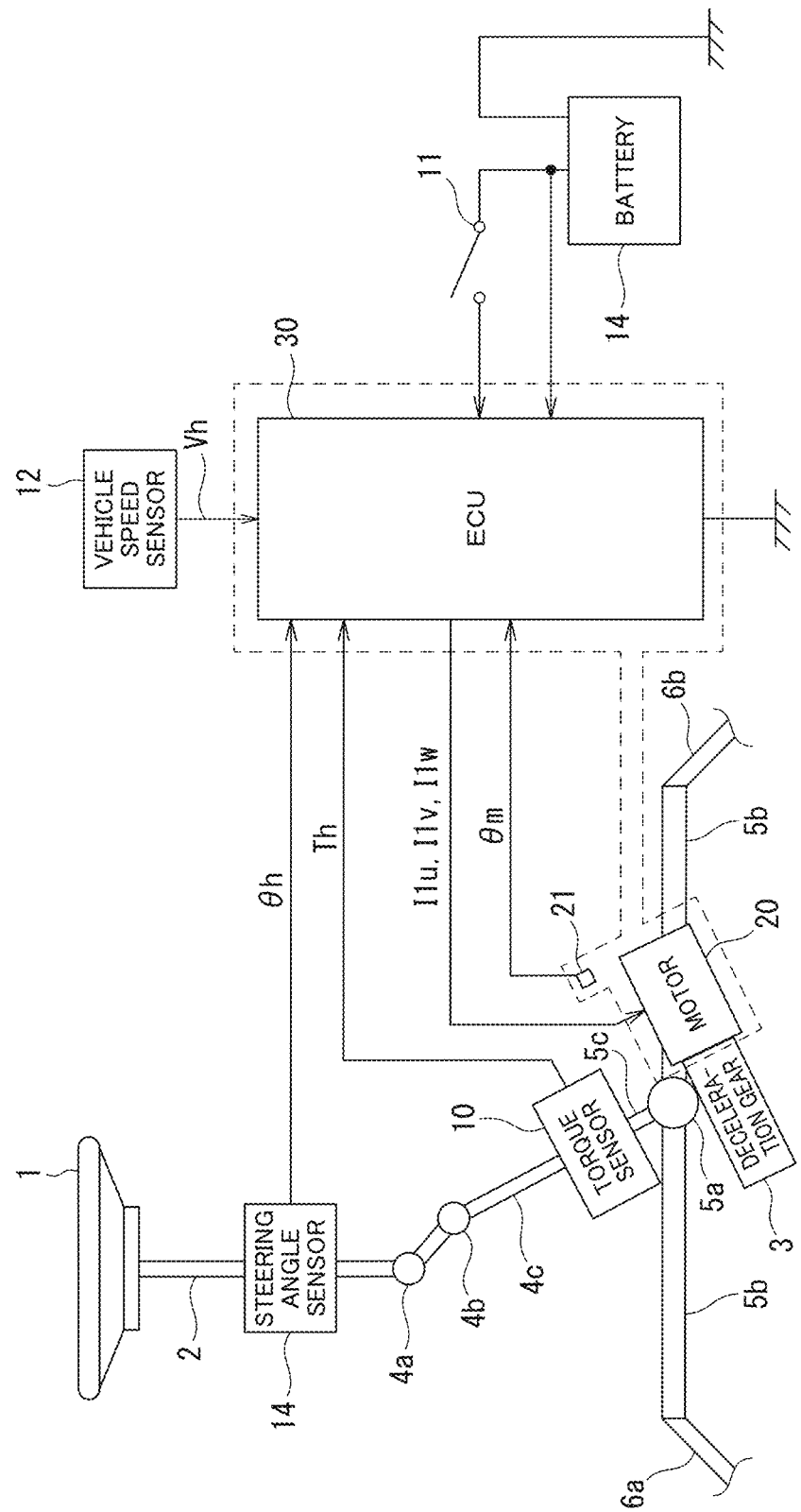
FIG. 10 is a configuration diagram illustrating an outline of a first modification of the electric power steering device.
Figure 11:
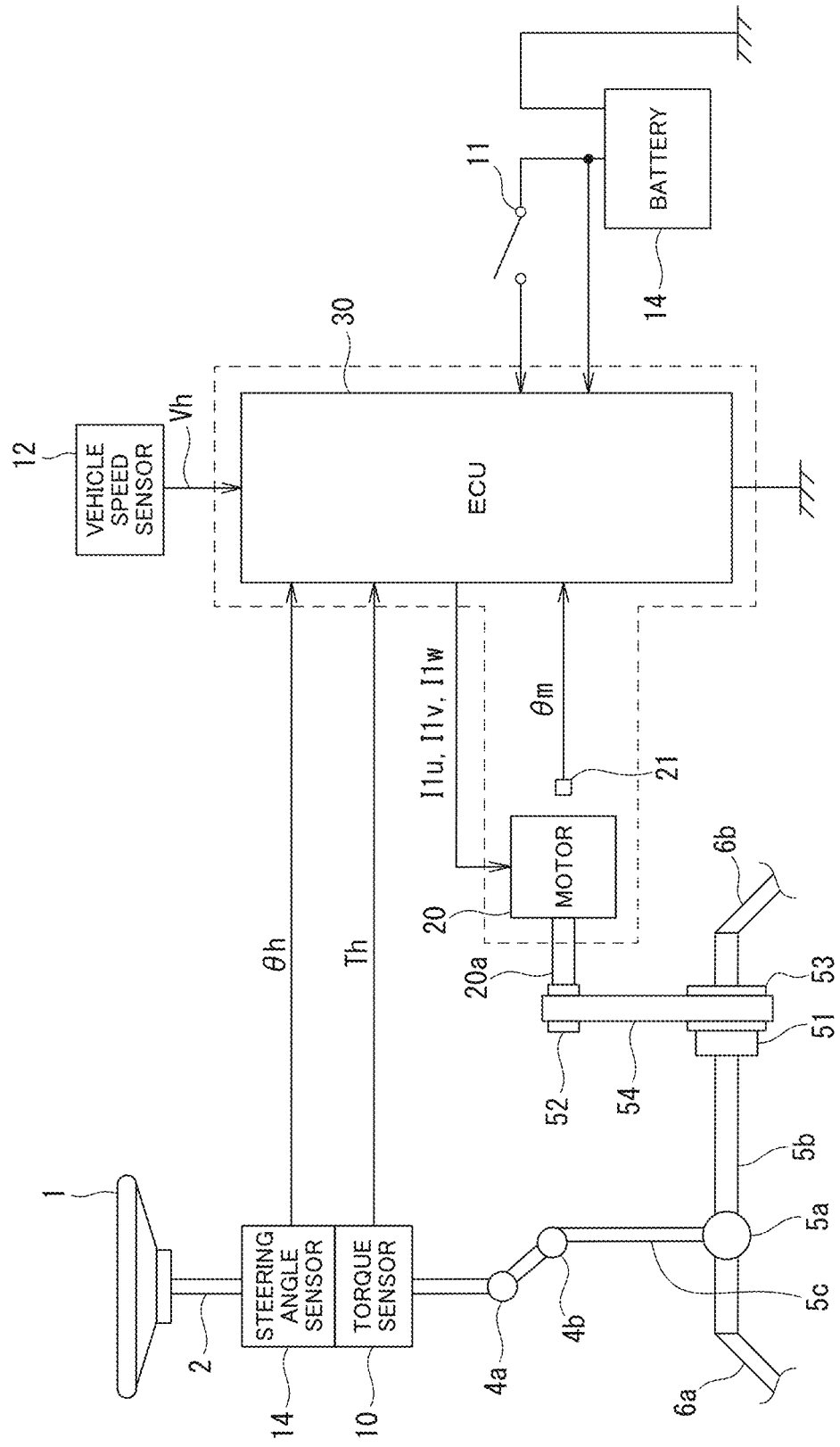
FIG. 11 is a configuration diagram illustrating an outline of a second modification of the electric power steering device.
Figure 12:
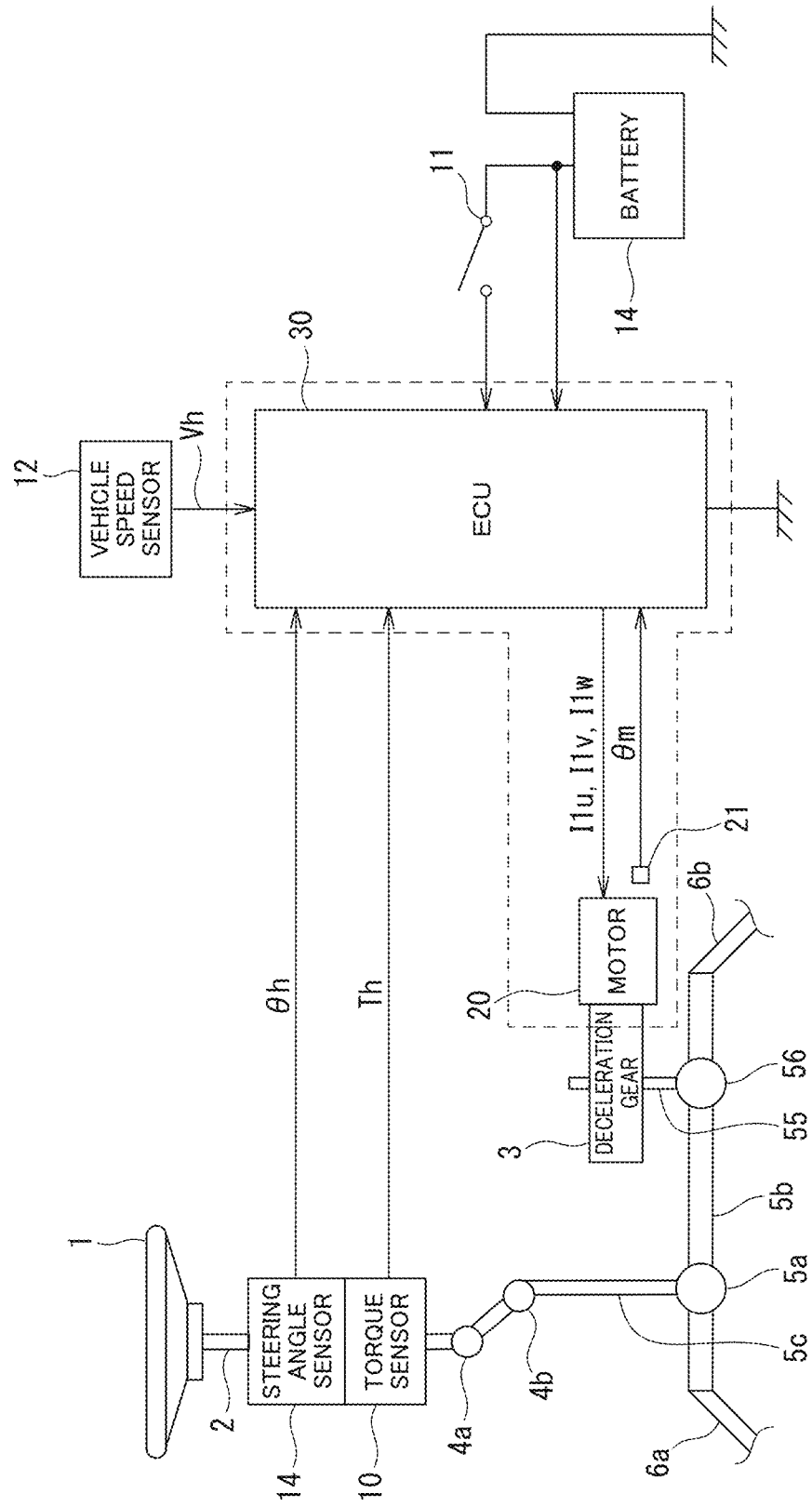
FIG. 12 is a configuration diagram illustrating an outline of a third modification of the electric power steering device.

Note that in the case of the downstream assist method, for the purpose of a waterproofing measure, the motor 20, rotational angle sensor 21 and ECU 30 may be formed, not as separate components, but as an MCU (Motor Control Unit) of an integral structure, as indicated by broken lines in FIG. 10 to FIG. 12.

FIG. 10 illustrates a configuration example in which the current detection device of the present invention is applied to the electric power steering device of the single pinion assist method. The steering wheel 1 is coupled to one universal joint 4a of an intermediate shaft via the steering shaft 2. In addition, an input-side shaft 4c of a torsion bar (not illustrated) is coupled to the other universal joint 4b.

The pinion rack mechanism 5 includes a pinion gear (pinion) 5a, a rack bar (rack) 5b and a pinion shaft 5c. The input-side shaft 4c and the pinion rack mechanism 5 are coupled by a torsion bar (not illustrated) that twists due to a displacement in rotational angle between the input-side shaft 4c and the pinion rack mechanism 5. The torque sensor 10 electromagnetically measures the angle of torsion of the torsion bar as the steering torque Th of the steering wheel 1.

The motor 20 that assists the steering force of the steering wheel 1 is coupled to the pinion shaft 5c via the deceleration gear 3, and, like the above-described embodiment, the rotational angle sensor 21 calculates rotational angle information of the motor rotational shaft of the motor 20.

FIG. 11 illustrates a configuration example in which the current detection device of the present invention is applied to the electric power steering device of the rack assist method. A helical groove (not illustrated) is formed on an outer peripheral surface of a rack bar 5b, and a helical groove (not illustrated) of a similar lead is also formed on an inner peripheral surface of a nut 51. A plurality of rolling bodies are disposed in a rolling path that is formed by these helical grooves, and thereby a ball screw is formed.

A belt 54 is wound around a driving pulley 52, which is coupled to a rotational shaft 20a of the motor 20 that assists the steering force of the steering wheel 1, and a driven pulley 53 coupled to the nut 51, and rotational motion of the rotational shaft 20a is converted into linear motion of the rack bar 5b. Like the above-described embodiment, the rotational angle sensor 21 calculates rotational angle information of the motor rotational shaft of the motor 20.

FIG. 12 illustrates a configuration example in which the current detection device of the present invention is applied to the electric power steering device of the dual pinion assist method. The electric power steering device of the dual pinion assist method includes, a second pinion shaft 55 and a second pinion gear 56, in addition to the pinion shaft 5c and pinion gear 5a, and the rack bar 5b includes first rack teeth (not illustrated) that are meshed with the pinion gear 5a, and second rack teeth (not illustrated) that are meshed with the second pinion gear 56.

The motor 20 that assists the steering force of the steering wheel 1 is coupled to the second pinion shaft 55 via the deceleration gear 3, and, like the above-described embodiment, the rotational angle sensor 21 calculates rotational angle information of the motor rotational shaft of the motor 20.

Advantageous Effects of the Embodiment (1) The ECU 30 includes a current detection unit 35*a* to 35*f* configured to detect current flowing through a switching element of one arm of either an upper-side arm or a lower-side arm of a multiphase inverter on which PWM control is executed, based on a voltage drop of a resistor element connected in series to the switching element; a correction value calculation unit 50*b* configured to calculate an offset correction value, based on a detection value of the current detected by the current detection unit 35*a* to 35*f* in a period during which the switching element is off during the PWM control, and to hold and update the calculated offset correction value; and a correction unit 50*c* configured to correct, by the offset correction value held by the correction value calculation unit 50*b*, the detection value of the current detected by the current detection unit 35*a* to 35*f* in a period during which the switching element is on. The correction value calculation unit 50*b* does not update the offset correction value in a case where the one switching element is the switching element of the lower-side arm and a duty ratio of the PWM control is equal to or less than a duty ratio lower limit value, or in a case where the one switching element is the switching element of the upper-side arm and the duty ratio is equal to or greater than a duty ratio upper limit value.

Thereby, it is possible to avoid such a situation that in a case where the duty ratio is small, the detection value of the current detection unit 35*a* to 35*f* cannot properly be sampled in the period during which the switching element of the lower-side arm is off, and the detection accuracy of the offset current deteriorates. Alternatively, it is possible to avoid such a situation that in a case where the duty ratio is large, the detection value of the current detection unit 35*a* to 35*f* cannot properly be sampled in the period during which the switching element of the upper-side arm is off, and the detection accuracy of the offset current deteriorates. As a result, the offset current occurring in the current detector that detects current flowing through the switching element of the multiphase inverter can accurately be detected during PWM control.

(2) In a case where the one switching element is the switching element of the lower-side arm and the duty ratio is equal to or less than the duty ratio lower limit value in at least one phase of phases of the multiphase inverter, or in a case where the one switching element is the switching element of the upper-side arm and the duty ratio is equal to or greater than the duty ratio upper limit value in at least one phase of phases of the multiphase inverter, the offset correction value in another phase of the phases of the multiphase inverter may not be updated.

Thereby, at a time of calculating the offset correction value in the another phase, the influence of noise due to the switching of the switching element can be avoided.

(3) The correction value calculation unit 50*b* may calculate, as the offset correction value, an average of detection values of current detected by the current detection unit 35*a* to 35*f* in a period of a predetermined length during which the switching element is off.

Thereby, minute noise of the detection value of the current detection unit 35*a* to 35*f* can be eliminated.

(4) In a case where the detection value of the current detected by the current detection unit 35*a* to 35*f* in the period during which the switching element is off exceeds an upper limit value, the correction value calculation unit 50*b* may not update the offset correction value by the detection value exceeding the upper limit value.

Thereby, it is possible to avoid the detection accuracy of the offset current deteriorating due to an abnormal detection value of the current detection unit 35*a* to 35*f*.

(5) In a case where the detection value of the current detected by the current detection unit 35*a* to 35*f* in the period during which the switching element is off exceeds the upper limit value in one phase of the phases of the multiphase inverter, and the detection value of the current detected by the current detection unit 35*a* to 35*f* in the period during which the switching element is off does not exceed the upper limit value in another phase of the phases of the multiphase inverter, the offset correction value in the another phase may be updated.

Even if an abnormal value is detected in a certain phase, if an abnormal value is not detected in another phase, there is no problem with the calculation of the offset correction value. Thus, by not prohibiting the update of the offset correction value in the another phase, the update of the offset correction value can be prohibited within a necessary range.

REFERENCE SIGNS LIST

1 . . . Steering wheel, 2 . . . Steering shaft, 3 . . . Deceleration gear, 4*a*, 4*b* . . . Universal joint, 4*c* . . . Input-side shaft, 5 . . . Pinion-rack mechanism, 5*a* . . . Pinion, 5*b* . . . Rack, 5*c* . . . Pinion shaft, 6*a*, 6*b* . . . Tie rod, 7*a*, 7*b* . . . Hub unit, 8L, 8R . . . Steered vehicle wheel, 10 . . . Torque sensor, 11 . . . Ignition switch, 12 . . . Vehicle speed sensor, 13 . . . Battery, 14 . . . Steering angle sensor, 20 . . . Motor, 20*a* . . . Rotational shaft, 21 . . . Rotational angle sensor, 30 . . . Electronic control unit, 31 . . . Control arithmetic unit, 32*a* . . . First system gate driving circuit, 32*b* . . . Second system gate driving circuit, 33*a* . . . First system inverter, 33*b* . . . Second system inverter, 34 . . . Motor rotational number calculation unit, 35*a* to 35*f* . . . Current detection unit, 36 . . . Differential amplifier circuit, 37 . . . Low-pass filter (LPF), 40 . . . Current command value calculation unit, 41, 42, 50*c* . . . Subtracter, 43 . . . Current limiting unit, 44 . . . Proportional-integral control unit, 45 . . . 2-phase/3-phase conversion unit, 46*a* to 46*c* . . . Current detection value correction unit, 47 . . . 3-phase/2-phase conversion unit, 48 . . . Angular velocity conversion unit, 50*a* . . . Scale conversion unit, 50*b* . . . Correction value calculation unit, 50*c* . . . Correction unit, 50*d* . . . Gain correction value storage unit, 50*e* . . . Multiplier, 51 . . . Nut, 52 . . . Driving pulley, 53 . . . Driven pulley, 54 . . . Belt, 55 . . . Second pinion shaft, 56 . . . Second pinion gear.

The invention claimed is:

1. A current detection device comprising:
a current detection unit configured to detect current flowing through a switching element of one arm of either an upper-side arm or a lower-side arm of a multiphase inverter on which PWM control is executed, based on a voltage drop of a resistor element connected in series to the switching element;
a correction value calculation unit configured to calculate an offset correction value, based on a detection value of the current detected by the current detection unit in a period during which the switching element is off during the PWM control, and to hold and update the calculated offset correction value; and
a correction unit configured to correct, by the offset correction value held by the correction value calculation unit, the detection value of the current detected by the current detection unit in a period during which the switching element is on, wherein the correction value calculation unit is configured to not update the offset correction value in a case where the switching element is the switching element of the lower-side arm and a duty ratio of the PWM control is equal to or less than a duty ratio lower limit value, or in a case where the switching element is the switching element of the upper-side arm and the duty ratio is equal to or greater than a duty ratio upper limit value, and in a case where the switching element is the switching element of the lower-side arm and the duty ratio is equal to or less than the duty ratio lower limit value in at least one phase of phases of the multiphase inverter, or in a case where the switching element is the switching element of the upper-side arm and the duty ratio is equal to or greater than the duty ratio upper limit value in at least one phase of the phases of the multiphase inverter, the correction value calculation unit is configured to not update the offset correction value in another phase of the phases of the multiphase inverter.

2. The current detection device according to claim 1, wherein the correction value calculation unit is configured to calculate, as the offset correction value, an average of detection values of current detected by the current detection unit in a period of a predetermined length during which the switching element is off.

3. The current detection device according to claim 1, wherein in a case where the detection value of the current detected by the current detection unit in the period during which the switching element is off exceeds an upper limit value, the correction value calculation unit is configured to not update the offset correction value by the detection value exceeding the upper limit value.

4. The current detection device according to claim 3, wherein in a case where the detection value of the current detected by the current detection unit in the period during which the switching element is off exceeds the upper limit value in one phase of the phases of the multiphase inverter, and the detection value of the current detected by the current detection unit in the period during which the switching element is off does not exceed the upper limit value in another phase of the phases of the multiphase inverter, the correction value calculation unit is configured to update the offset correction value in the another phase.

5. A motor control device comprising:
a multiphase inverter including a switching element;
the current detection device according to claim 1, the current detection device being configured to detect current flowing through the switching element; and
a controller configured to control the multiphase inverter, based on a detection current value by the current detection device.

6. An electric power steering device comprising:
the motor control device according to claim 5; and
a multiphase motor configured to be controlled by the motor control device,
wherein steering assistance force is given to a steering system of a vehicle by the multiphase motor.

7. A current detection device comprising:
a current detection unit configured to detect current flowing through a switching element of one arm of either an upper-side arm or a lower-side arm of a multiphase inverter on which PWM control is executed, based on a voltage drop of a resistor element connected in series to the switching element;
a correction value calculation unit configured to calculate an offset correction value, based on a detection value of the current detected by the current detection unit in a period during which the switching element is off during the PWM control, and to hold and update the calculated offset correction value; and
a correction unit configured to correct, by the offset correction value held by the correction value calculation unit, the detection value of the current detected by the current detection unit in a period during which the switching element is on, wherein the correction value calculation unit is configured to not update the offset correction value in a case where the switching element is the switching element of the lower-side arm and a duty ratio of the PWM control is equal to or less than a duty ratio lower limit value, or in a case where the switching element is the switching element of the upper-side arm and the duty ratio is equal to or greater than a duty ratio upper limit value, and in a case where the detection value of the current detected by the current detection unit in the period during which the switching element is off exceeds an upper limit value, the correction value calculation unit is configured to not update the offset correction value by the detection value exceeding the upper limit value.

8. The current detection device according to claim 7, wherein in a case where the detection value of the current detected by the current detection unit in the period during which the switching element is off exceeds the upper limit value in one phase of the phases of the multiphase inverter, and the detection value of the current detected by the current detection unit in the period during which the switching element is off does not exceed the upper limit value in another phase of the phases of the multiphase inverter, the correction value calculation unit is configured to update the offset correction value in the another phase.

9. A motor control device comprising:
a multiphase inverter including a switching element;
the current detection device according to claim 7, the current detection device being configured to detect current flowing through the switching element; and
a controller configured to control the multiphase inverter, based on a detection current value by the current detection device.

10. An electric power steering device comprising:
the motor control device according to claim 9; and
a multiphase motor configured to be controlled by the motor control device,
wherein steering assistance force is given to a steering system of a vehicle by the multiphase motor.

* * * * *